(12) United States Patent
Li

(10) Patent No.: US 11,043,500 B1
(45) Date of Patent: Jun. 22, 2021

(54) INTEGRATED ASSEMBLIES COMPRISING TWISTED DIGIT LINE CONFIGURATIONS

(71) Applicant: Micron Technology, Inc., Boise, ID (US)

(72) Inventor: Jiyun Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/824,132

(22) Filed: Mar. 19, 2020

(51) Int. Cl.
*G11C 11/408* (2006.01)
*H01L 27/108* (2006.01)
*H01L 23/528* (2006.01)
*G11C 11/4091* (2006.01)

(52) U.S. Cl.
CPC .... *H01L 27/10897* (2013.01); *G11C 11/4085* (2013.01); *G11C 11/4091* (2013.01); *H01L 23/528* (2013.01); *H01L 27/10805* (2013.01)

(58) Field of Classification Search
CPC ............. H01L 27/10897; H01L 23/528; H01L 27/10805; G11C 11/4091; G11C 11/4085
USPC .................................................. 365/51, 205
See application file for complete search history.

(56) References Cited

U.S. PATENT DOCUMENTS

| | | | | |
|---|---|---|---|---|
| 5,107,459 A * | 4/1992 | Chu | ................... | H01L 27/10841 257/302 |
| 5,214,601 A * | 5/1993 | Hidaka | ................... | G11C 5/063 365/190 |
| 9,853,053 B2 * | 12/2017 | Lupino | ............... | H01L 27/2481 |
| 2002/0056912 A1 * | 5/2002 | Roth | .................... | H01L 23/5225 257/750 |
| 2006/0055045 A1 * | 3/2006 | Park | ..................... | H01L 27/1052 257/758 |
| 2007/0133246 A1 * | 6/2007 | Oosaka | .................. | G11C 5/025 365/63 |
| 2008/0037356 A1 * | 2/2008 | Kajigaya | .................. | G11C 8/10 365/230.03 |
| 2008/0173932 A1 * | 7/2008 | Kidoh | ............... | H01L 29/66833 257/324 |
| 2010/0046267 A1 * | 2/2010 | Yan | ..................... | G11C 13/0028 365/51 |
| 2010/0214823 A1 * | 8/2010 | Ogawa | ................ | H01L 27/0207 365/149 |
| 2011/0273927 A1 * | 11/2011 | Hanzawa | ........... | G11C 13/0026 365/163 |

(Continued)

OTHER PUBLICATIONS

Hidaka et al., "Twisted Bit-Line Architectures for Multi-Megabit DRAM's", IEEE Journal of Solid-State Circuits, vol. 24, Feb. 1989, United States, pp. 21-27.

*Primary Examiner* — Michael T Tran
(74) *Attorney, Agent, or Firm* — Wells St. John P.S.

(57) ABSTRACT

Some embodiments include an integrated assembly having a first deck, and having a second deck over the first deck. A first true digit line has a first region along the first deck, and has a second region along the second deck. A first complementary digit line has a first region along the first deck, and has a second region along the second deck. The first true digit line is comparatively compared to the first complementary digit line through SENSE AMPLIFIER circuitry. A second digit line has a first region along the first deck and laterally adjacent the first region of the first complementary digit line, and has a second region along the second deck and laterally adjacent the second region of the first true digit line.

33 Claims, 16 Drawing Sheets

(56) References Cited

U.S. PATENT DOCUMENTS

| | | | |
|---|---|---|---|
| 2012/0044734 A1* | 2/2012 | Lee | G11C 7/12 |
| | | | 365/63 |
| 2013/0070506 A1* | 3/2013 | Kajigaya | H01L 27/2436 |
| | | | 365/51 |
| 2014/0211566 A1* | 7/2014 | Kono | G11C 16/26 |
| | | | 365/185.05 |
| 2014/0286103 A1* | 9/2014 | Akou | H01L 27/11524 |
| | | | 365/185.21 |
| 2018/0158800 A1* | 6/2018 | El-Mansouri | H01L 25/0657 |
| 2019/0244971 A1* | 8/2019 | Harari | H01L 27/11573 |
| 2019/0319044 A1* | 10/2019 | Harari | G11C 16/0483 |
| 2020/0111810 A1* | 4/2020 | Tagami | H01L 27/1157 |
| 2020/0286875 A1* | 9/2020 | Nishida | H01L 27/11575 |
| 2021/0035881 A1* | 2/2021 | Mallik | H01L 21/565 |

\* cited by examiner

INTEGRATED ASSEMBLIES COMPRISING TWISTED DIGIT LINE CONFIGURATIONS

TECHNICAL FIELD

Memory arrays (e.g., DRAM arrays). Integrated assemblies comprising vertically-stacked decks. Integrated assemblies comprising twisted digit line configurations.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line, routing line, first linear structure, etc.), and has a source/drain region coupled to a bitline BL (i.e., digit line, sense line, second linear structure, etc.). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (ARRAY-1), and digit lines D0*-D8* are associated with the second array (ARRAY-2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

Highly integrated memory has closely spaced memory cells and digit lines. Problems may be encountered due to undesired capacitive coupling between closely spaced digit lines. The capacitive coupling may lead to excessive noise during data reading operations, and is becoming increasingly problematic with increasing levels of integration. It is desired to develop new architectures which can reduce or eliminate problematic capacitive coupling.

DETAILED DESCRIPTION OF THE ILLUSTRATED EMBODIMENTS

Some embodiments include integrated assemblies having twisted-digit-line-configurations (i.e., twisted-bitline-configurations). The twisted-digit-line-configurations may reduce or eliminate problematic capacitive coupling. Some conventional assemblies may utilize shielding between adjacent digit lines to reduce problematic capacitive coupling. Embodiments described herein may eliminate problematic coupling without utilizing such shielding. The omission of the shielding may simplify fabrication of the architectures described herein as compared to conventional architectures comprising shielding, and may enable architectures described herein to be formed to tighter packing of adjacent digit lines as compared to architectures having shielding between adjacent digit lines. Example embodiments are described with reference to FIGS. 4-14.

Figure 4:
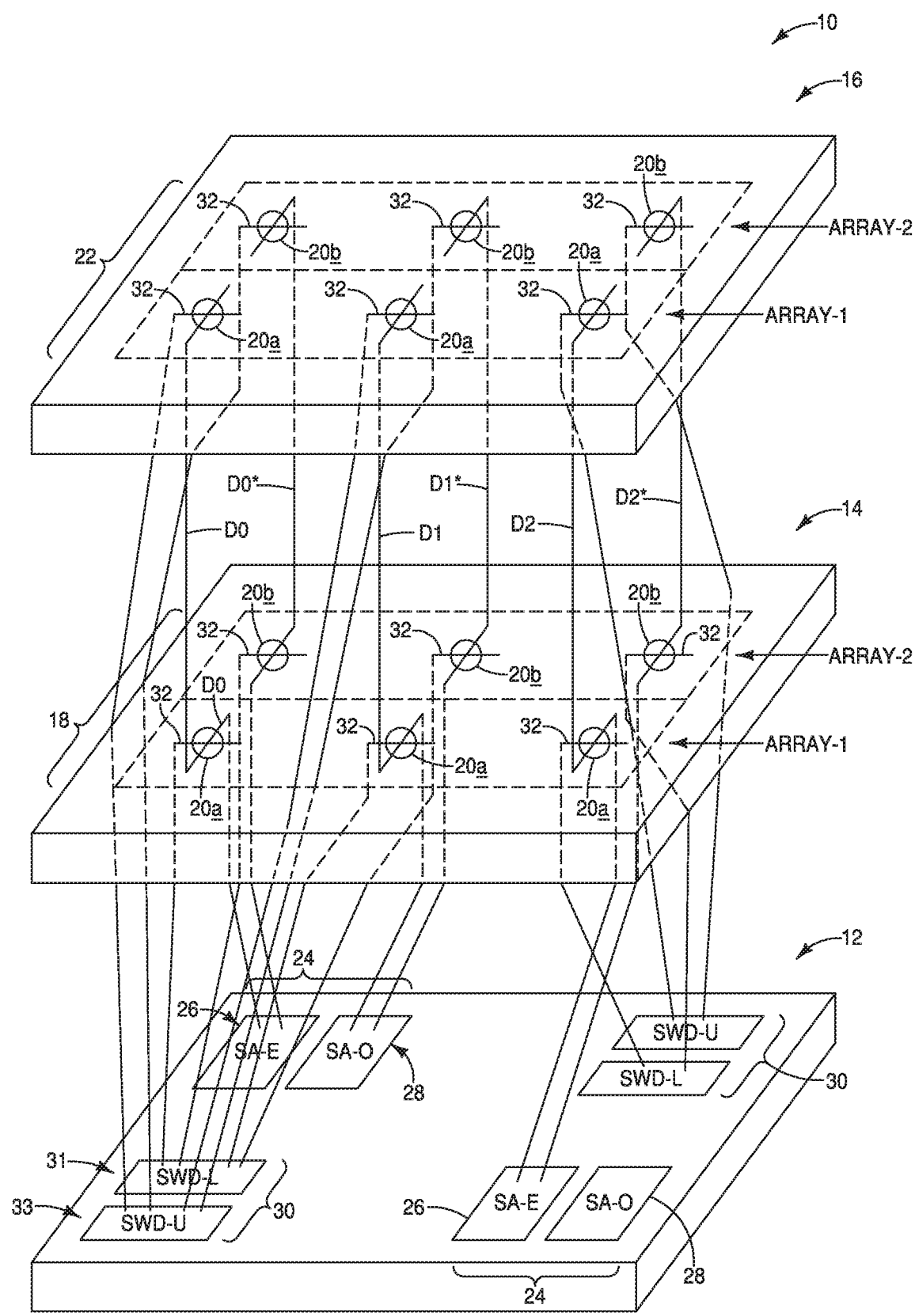
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck. The structures 12, 14 and 16 are vertically stacked one atop another. The base 12, first deck 14 and second deck 16 may be considered to be examples of levels (tiers) that are stacked one atop the other. The levels may be within different semiconductor dies, or at least two of the levels may be within the same semiconductor die.

Figure 1:
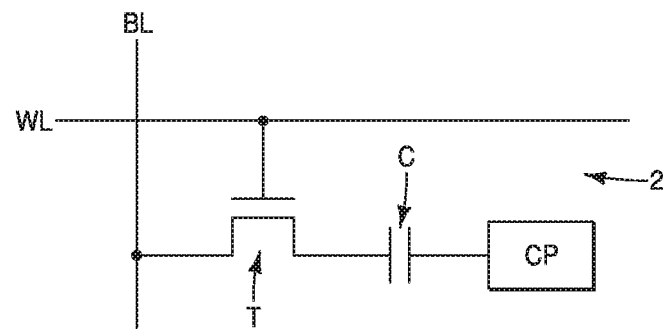
FIG. 1 is a schematic diagram of a prior art memory cell having 1 transistor and 1 capacitor.
Figure 2:
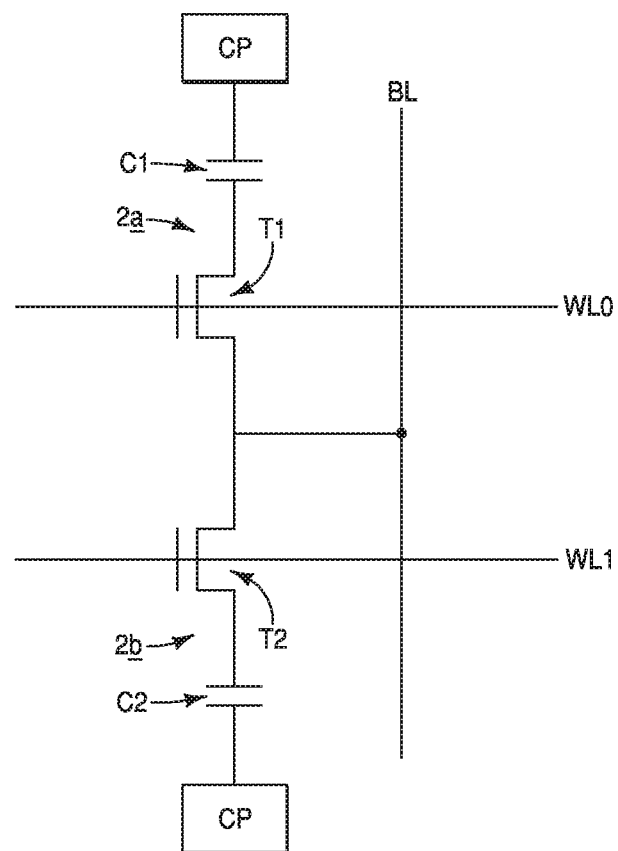
FIG. 2 is a schematic diagram of a pair of prior art memory cells which each have 1 transistor and 1 capacitor, and which share a bitline connection.
Figure 3:
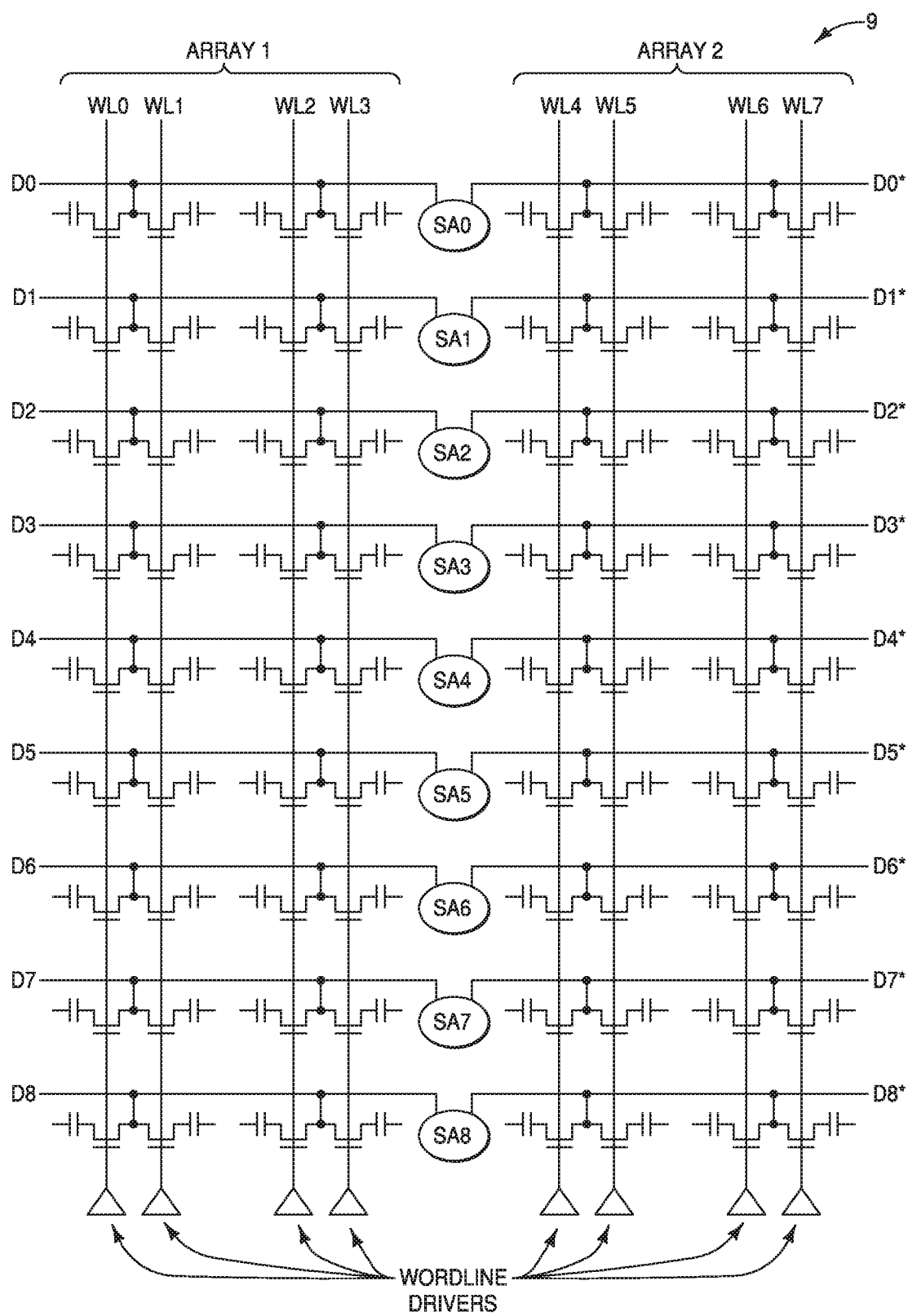
FIG. 3 is a schematic diagram of a prior art integrated assembly having open bitline architecture.

The first and second decks 14 and 16 have memory regions 18 and 22, respectively. First and second memory arrays (ARRAY-1 and ARRAY-2) are supported by the first and second decks 14 and 16, with each of the memory arrays having a first portion along the first (lower) deck 14 and a second portion along the second (upper) deck 16. The first memory array includes first memory cells 20a, and the second memory array includes second memory cells 20b. The memory cells are diagrammatically illustrated as circles. The first and second memory arrays may comprise any suitable number of memory cells, and in some embodiments may comprise hundreds, thousands, millions, etc., of memory cells. The memory cells may be DRAM cells, and in some embodiments may be configured in arrangements of the types described above with reference to prior art FIGS. 1-3 (i.e., ARRAY-1 and ARRAY-2 may be DRAM arrays). ARRAY-1 and ARRAY-2 are shown to be separated from one another to simplify the illustration of FIG. 4. In some embodiments, regions of ARRAY-1 may overlap regions of ARRAY-2 as is illustrated in the embodiments described below with reference to FIGS. 5-14.

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises SENSE AMPLIFIER circuitry (SA), and WORDLINE DRIVER circuitry (WD).

The SENSE AMPLIFIER circuitry includes regions labeled "SA-E" to identify them as being associated with an "even" portion of a circuit, and regions labeled "SA-O" to identify them as being associated with an "odd" portion of a circuit. The terms "even" and "odd" are arbitrary, and are utilized to distinguish the different sense-amplifier-circuitries from one another. The illustrated configuration has the SENSE AMPLIFIER circuitries SA-O and SA-E paired with one another and distributed as structures (blocks) 24. The SENSE AMPLIFIER circuitries SA-E and SA-O may be referred to as first and second SENSE AMPLIFIER circuitries, respectively. In some embodiments, the SENSE AMPLIFIER circuitries SA-E may be considered to correspond to a first set of the SENSE AMPLIFIER circuitries and the SENSE AMPLIFIER circuitries SA-O may be considered to correspond to a second set of the SENSE AMPLIFIER circuitries; or vice versa.

The WORDLINE DRIVER circuitry (i.e., row-driver circuitry) includes regions labeled SWD-L and SWD-U. The acronym SWD stands for sub-wordline-driver, and is utilized to emphasize that the components SWD-L and SWD-U are portions of the general WORDLINE DRIVER circuitry. The WORDLINE DRIVER circuitries SWD-L are utilized during operation of the memory cells associated with the lower deck 14, and the WORDLINE DRIVER circuitries SWD-U are utilized during operation of the memory cells associated with the upper deck 16.

The illustrated configuration has the wordline-driver-circuitries SWD-L and SWD-U paired with one another and distributed as structures (blocks) 30.

The blocks 24 and 30 may be considered to form patch regions. The patch regions may be considered together to form a quilted arrangement of the circuit subunits along the base 12.

First digit lines D0, D1 and D2 are associated with the first memory array (ARRAY-1). The first digit lines D0, D1 and D2 extend along the first memory array (ARRAY-1) and are coupled with first memory cells 20a of the first memory array. The digit lines D0, D1 and D2 are laterally spaced from one another, and may be representative of a large number of substantially identical digit lines extending across the first memory array; with the term "substantially identical" meaning identical to within reasonable tolerances of fabrication and measurement. The first digit lines alternate between even first digit lines and odd first digit lines, with the digit lines D0 and D2 being representative of even first digit lines, and the digit line D1 being representative of an odd first digit line. The even first digit lines (e.g., D0) are coupled with the first SENSE AMPLIFIER circuitry 26 (i.e., SA-E), and the odd first digit lines (e.g., D1) are coupled with the second SENSE AMPLIFIER circuitry 28 (i.e., SA-O). The first digit lines D0, D1 and D2 have first portions along the first deck 14, and have second portions along the second deck 16.

Second digit lines D0*, D1* and D2* are associated with the second memory array (ARRAY-2). The second digit lines D0*. D1* and D2* extend along the second memory array and are coupled with second memory cells 20b of the second memory array (ARRAY-2). The digit lines D0*, D1* and D2* are laterally spaced from one another, and may be representative of a large number of substantially identical digit lines extending across the second memory array. The second digit lines alternate between even second digit lines and odd second digit lines, with the digit lines D0* and D2* being representative of even second digit lines, and the digit line D1* being representative of an odd second digit line. The even second digit lines (e.g., D0*) are coupled with the first SENSE AMPLIFIER circuitry 26 (SA-E), and the odd second digit lines (e.g., D1*) are coupled with the second SENSE AMPLIFIER circuitry 28 (SA-O). The second digit lines D0*, D1* and D2* have first portions along the first deck 14, and have second portions along the second deck 16.

The even first digit lines D0 and D2 are comparatively coupled with the even second digit lines D0* and D2* through the first SENSE AMPLIFIER circuitry 26 (SA-E); and the odd first digit line D1 is comparatively coupled with the odd second digit line D1* through the second SENSE AMPLIFIER circuitry 28 (SA-O). For purposes of understanding this disclosure and the claims that follow, a first digit line is "comparatively coupled" with a second digit line through a SENSE AMPLIFIER circuitry if the SENSE AMPLIFIER circuitry is configured to compare electrical properties (e.g., voltage) of the first and second digit lines with one another.

Two digit lines which are comparatively coupled with one another through SENSE AMPLIFIER circuitry may be considered to include a true digit line and a complementary digit line. For instance, the digit lines D0 and D0* may be considered to be a true digit line and a complementary digit line, respectively; and similarly the digit lines D1 and D1* may be considered to be a true digit line and a complementary digit line, respectively. The terms "true" and "complementary" are arbitrary. The electrical values of the true and complementary digit lines of the set are utilized together during reading/writing operations of memory cells (e.g., 20a, 20b) associated with such set. For purposes of describing the embodiments herein, the true digit lines will be those indicated without an asterisk in the label (e.g., D0, D1, D2, etc.), and the complementary digit lines will be those indicated with an asterisk in the label (e.g., D0*, D1*, D2*, etc.).

Referring still to FIG. 4, wordlines 32 extend along the first and second memory arrays (ARRAY-1 and ARRAY-2).

Each of the first memory cells 20a within the first memory array (ARRAY-1) is uniquely addressed by one of the digit lines extending along the first memory array (e.g., one of the digit lines D0, D1 and D2), and one of the wordlines 32. Similarly, each of the memory cells 20b within the second memory array (ARRAY-2) is uniquely addressed by one of the digit lines extending along the second memory array (e.g., one of the digit lines D0*, D1* and D2*), and one of the wordlines 32. In some embodiments, the digit lines along the first memory array (ARRAY-1) may be referred to as a first set of digit lines, while the digit lines along the second memory (ARRAY-2) are referred to as a second set of digit lines.

An advantage of the configuration of FIG. 4 is that all of the SENSE AMPLIFIER circuitry and all of the WORD-LINE DRIVER circuitry may be provided directly under the memory arrays (ARRAY-1 and ARRAY-2), which may enable tight packing of the memory arrays across a semiconductor substrate; or in other words, which may conserve valuable semiconductor real estate as compared to conventional configurations in which at least some of the SENSE AMPLIFIER circuitry and/or at least some of the WORD-LINE DRIVER circuitry is not directly under a memory array. The vertical stacking of regions of the memory arrays (ARRAY-1 and ARRAY-2) may further conserve valuable semiconductor real estate. In the illustrated embodiment of FIG. 4, the digit lines D0, D0*, D1, D1*, D2 and D2* are all vertically displaced relative to the first and second SENSE AMPLIFIER circuitries SA-E and SA-0, and are vertically displaced relative to the WORDLINE DRIVER circuitries SWD-U and SWD-L.

Figure 5:
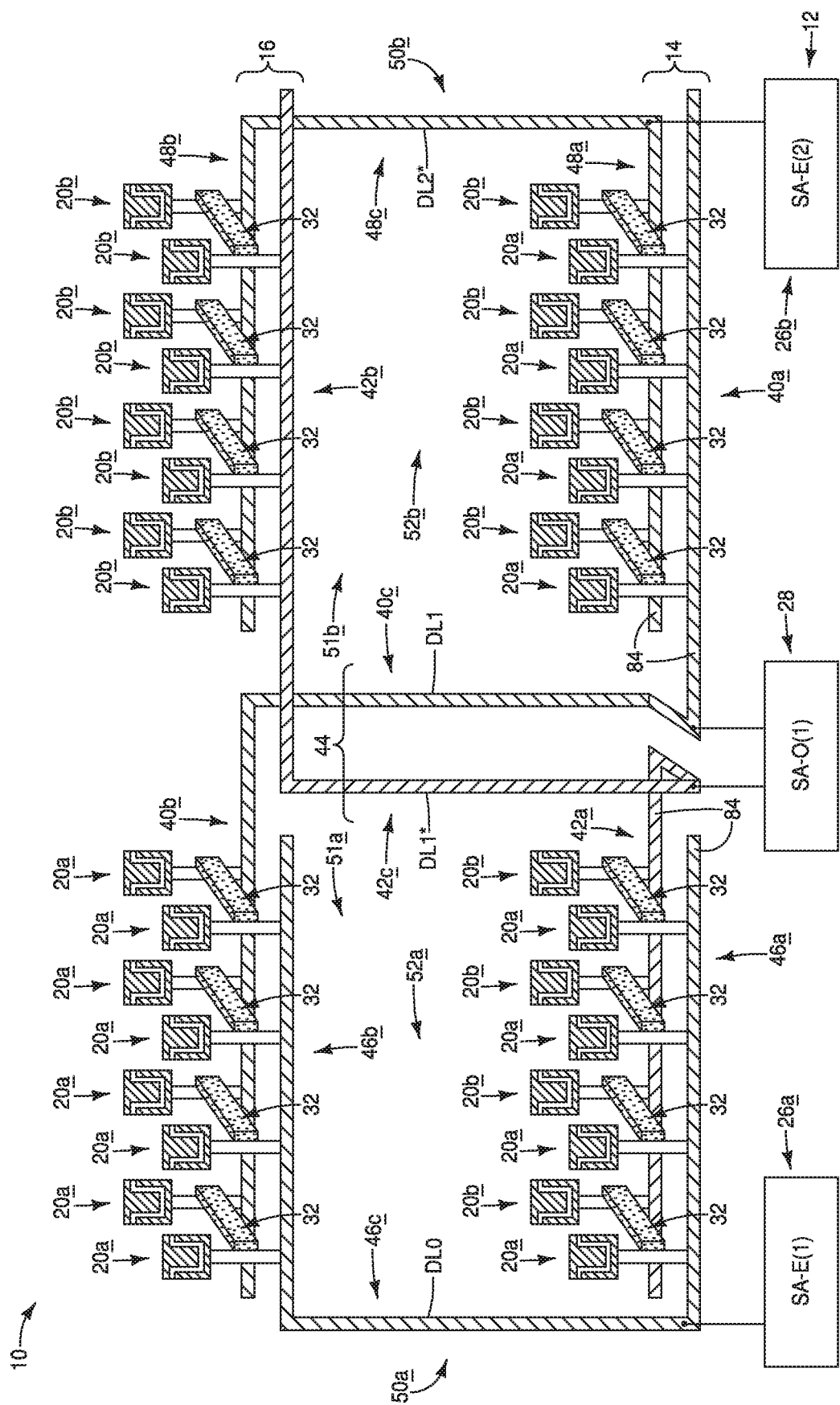
FIG. 5 is a diagrammatic multi-dimensional side view of an example layout of complementary digit lines within the example decks of FIG. 4.

The digit lines of FIG. 4 are not twisted in order to simplify the drawing. However, embodiments described herein may include twisted-digit-line configurations. For instance, FIG. 5 shows a region of an example integrated assembly 10 in accordance with an example embodiment having a twisted-digit-line-configuration. The twisted digit lines include digit lines DL1 and DL1*. The digit lines DL1 and DL1* are comparatively coupled to one another through SENSE AMPLIFIER circuitry 28 identified as SA-O(1). The digit line DL1 may be referred to as the true digit line, and the digit line DL1* may be referred to as the complementary digit line. In some embodiments, the digit lines DL1 and DL1* may be referred to as first digit lines to distinguish them from other digit lines shown in FIG. 5; and in such embodiments the digit line DL1 may be referred to as a first true digit line, and the digit line DL1* may be referred to as a first complementary digit line.

The base 12, first deck 14 and second deck 16 are diagrammatically represented in FIG. 5 with different elevational levels. The true digit line DL1 is illustrated to have a first region 40a along (associated with) the first deck (lower deck) 14, a second region 40b along (associated with) the second deck (upper deck) 16, and a vertically-extending segment 40c between the first and second segments 40a and 40b. The complementary digit line DL1* is illustrated to have a first region 42a along (associated with) the first deck (lower deck) 14, a second region 42b along (associated with) the second deck (upper deck) 16, and a vertically-extending segment 42c between the first and second segments 40a and 40b. The vertically-extending segments 40c and 42c may be referred to as first and second vertically-extending segments, respectively. A region 44 comprising the vertically-extending segments 40c and 42c may be referred to as a twist region.

The assembly 10 also includes a digit line DL0 on one side of the twist region 44, and another digit line DL2* on an opposing side of the twist region 44. The digit line DL0 may be referred to as a true digit line, and the digit line DL2* may be referred to as a complementary digit line. In the illustrated embodiment, the true digit line DL0 is not comparatively coupled to the complementary digit line DL2*. Instead, the digit line DL0 is coupled with first SENSE AMPLIFIER circuitry 26a (SA-E(1)) and the digit line DL2* is coupled with second SENSE AMPLIFIER circuitry 26b (SA-E(2)).

The digit lines DL0 and DL2* may be referred to as second digit lines to distinguish them from the first digit lines DL1 and DL1*; and in some embodiments the digit line DL0 may be referred to as a second true digit line, and the digit line DL2* may be referred to as a second complementary digit line.

The true digit line DL0 is illustrated to have a first region 46a along (associated with) the first deck (lower deck) 14, a second region 46b along (associated with) the second deck (upper deck) 16, and a vertically-extending segment 46c between the first and second segments 46a and 46b. The complementary digit line DL2* is illustrated to have a first region 48a along (associated with) the first deck (lower deck) 14, a second region 48b along (associated with) the second deck (upper deck) 16, and a vertically-extending segment 48c between the first and second segments 48a and 48b. The vertically-extending segments 46c and 48c may be referred to as third and fourth vertically-extending segments, respectively.

In some embodiments, the regions 40a, 40b, 42a, 42b, 46a, 46b, 48a and 48b may be considered to be end sections (end regions) of the various digit lines, and the vertically-extending segments 40c, 42c, 46c and 48c may be considered to extend between the end sections.

The first region 46a of the second true digit line DL0 is laterally adjacent the first region 42a of the first complementary digit line DL1*, and in some embodiments may be considered to be a neighbor (in some applications, a nearest neighbor) to the first region of the first complementary digit line.

The second region 46b of the second true digit line DL0 is laterally adjacent the second region 40b of the first true digit line DL1, and in some embodiments may be considered to be a neighbor (in some applications, a nearest neighbor) to the second region of the first true digit line.

The first region 48a of the second complementary digit line DL2* is laterally adjacent the first region 40a of the first true digit line DL1, and in some embodiments may be considered to be a neighbor (in some applications, a nearest neighbor) to the first region of the first true digit line.

The second region 48b of the second complementary digit line DL2* is laterally adjacent the second region 42b of the first complementary digit line DL1*, and in some embodiments may be considered to be a neighbor (in some applications, a nearest neighbor) to the second region of the first complementary digit line.

The SENSE AMPLIFIER circuitries 26a, 26b and 28 are associated with (along) the base 12.

Example memory cells 20a and 20b are shown along elevational levels corresponding to the decks 14 and 16, and wordlines 32 are also shown along the elevational levels corresponding to the decks 14 and 16. Each of the memory cells 20a of ARRAY-1 is uniquely addressed by a true digit line (DL0 or DL1) and a wordline 32. Similarly, each of the memory cells 20b of ARRAY-2 is uniquely addressed by a complementary digit line (DL1* or DL2*) and a wordline 32. The wordlines extend along rows of the memory cells 20a/20b.

In the illustrated embodiment, wordlines extend from memory cells 20a along the first region 46a of the second true digit line DL0 to memory cells 20b along the first region 42a of the first complementary digit line DL1*; wordlines extend from memory cells 20a along the second region 46b of the second true digit line DL0 to memory cells 20a along the second region 40b of the first true digit line DL1; wordlines extend from memory cells 20b along the first region 48a of the second complementary digit line DL2* to memory cells 20a along the first region 40a of the first true digit line DL1; and wordlines extend from memory cells 20b along the second region 48b of the second complementary digit line DL2* to memory cells 20b along the second region 42b of the first complementary digit line DL1*.

WORDLINE DRIVER circuitries (SWD-U and SWD-L) may be supported by the base 12 and may be coupled with the wordlines 32. The WORDLINE DRIVER circuitries are not shown in FIG. 5 in order to simplify the drawing.

The memory cells 20a and 20b may have any suitable configuration. An example memory cell 20 is shown in enlarged view in FIG. 5B to simplify the labeling of the components of the memory cell. The memory cell 20 includes a transistor T coupled with a capacitor C. The transistor T comprises a vertically-extending pillar 70 of semiconductor material 72. The semiconductor material 72 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

Gate dielectric material (insulative material) 74 is along sidewalls of the pillar 70, and conductive gate material 76 is along the gate dielectric material.

The gate dielectric material 74 may comprise any suitable composition(s); and in some embodiments may comprise, consist essentially of, or consist of silicon dioxide.

The conductive gate material 76 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive gate material 76 forms the transistor gate of the transistor T. The transistor includes a first source/drain region 86 within an upper region of the pillar 70, a second source/drain region 88 within a lower region of the pillar 70, and a channel region 90 between the first and second source/drain regions 86 and 88. In operation, an electrical field generated by voltage within the gate material 76 (i.e., voltage along a wordline 32 coupled with the gate material 76) may gatedly couple the source/drain regions 86 and 88 to one another through the channel region 90. When the term "gated coupling" is utilized herein, such may refer to the controlled coupling/decoupling of source/drain regions of a transistor that may be induced by electrical activation/deactivation of the gate of the transistor.

The capacitor C comprises a first conductive node 78, a second conductive node 80, and an insulative material (capacitor dielectric material) 82 between the first and second conductive nodes.

The first and second conductive nodes 78 and 80 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another.

The insulative material 82 may comprise any suitable composition(s), and in some embodiments may comprise, consist essentially of, or consist of silicon dioxide.

In the shown embodiment, the lower conductive node 78 is configured as an upwardly-opening container. In other embodiments, the lower conductive node may have another suitable shape.

Figure 5A:
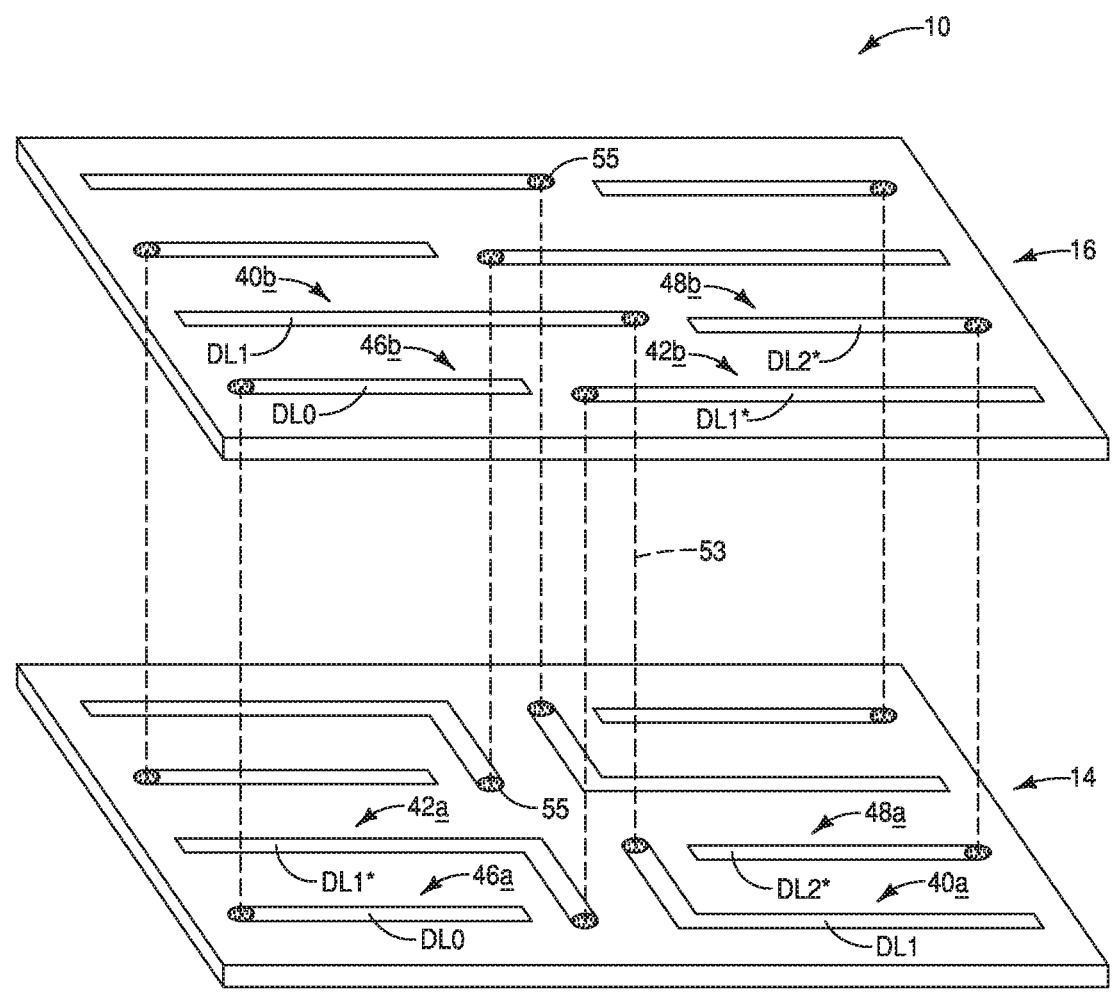
FIG. 5A is an alternative multi-dimensional view of the layout of FIG. 5.
Figure 5B:
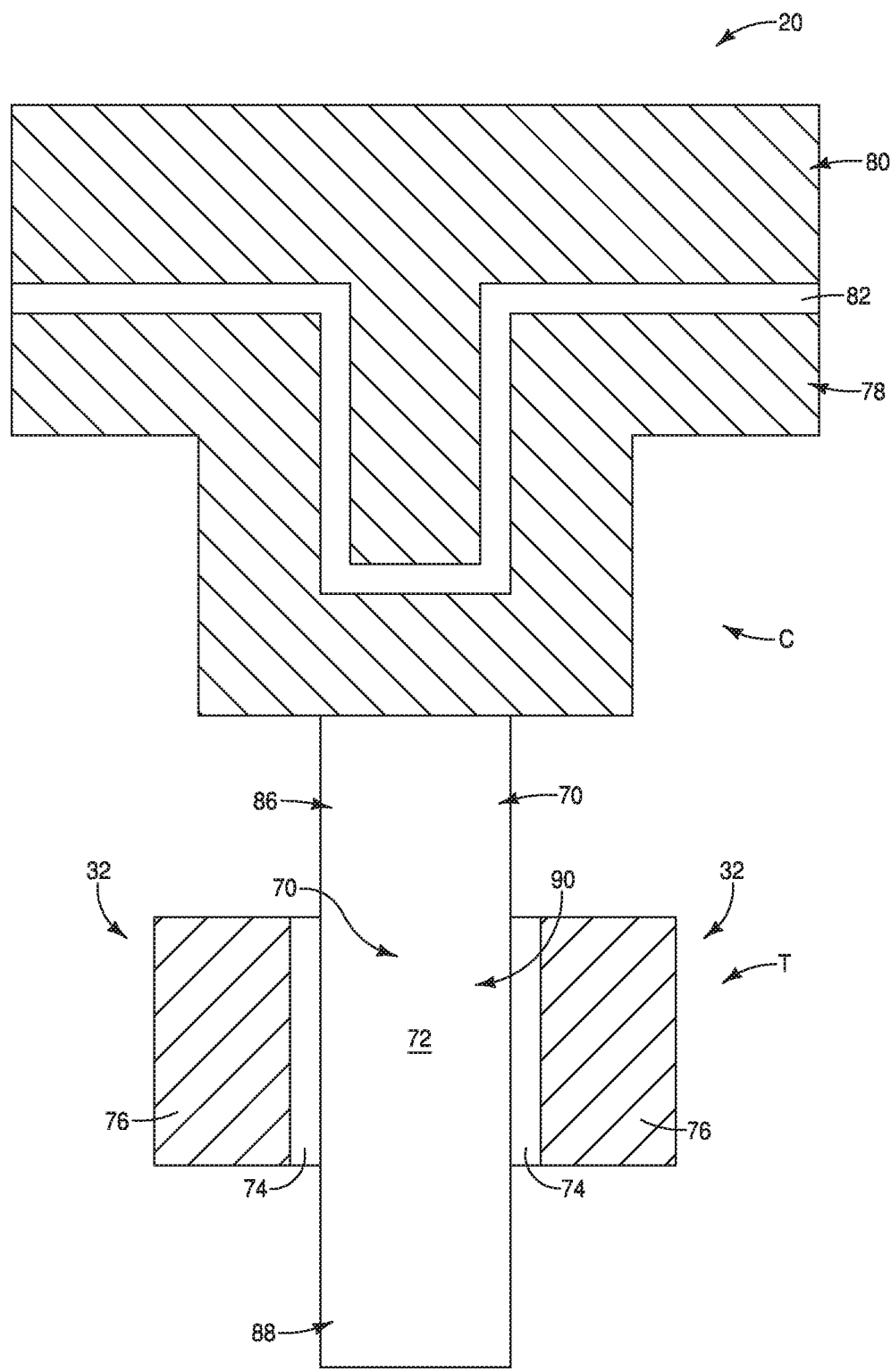
FIG. 5B is a diagrammatic side view of one of the memory cells of FIG. 5.

The wordlines 32 (gate material 76) are on two sides of the channel region 70 in the view of FIG. 5B, and are on one side of the channel regions in the view of FIG. 5. The wordlines (gate material), may be in any suitable configuration relative to the channel regions of the transistors; and in some applications may be on one side of the channel regions, on two sides of the channel regions, or may entirely surround the channel regions (i.e., may be in a gate-all-around configurations).

The digit lines DL0, DL1, DL1* and DL2* of FIG. 5 comprise conductive material 84. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The second true digit line DL0 is configured as a first sideways-opening container 50a, and the second complementary digit line DL2* is configured as a second sideways-opening container 50b. The first sideways-opening container 50a has a first closed end corresponding to the vertically-extending segment 46c, and has a first open end (open edge) 51a in opposing relation to the first close end. The second sideways-opening container 50b has a second closed end corresponding to the vertically-extending segment 48c, and has a second open end (open edge) 51b in opposing relation to the first close end. The first and second sideways-opening containers may be considered to have first and second openings 52a and 52b therein. In the illustrated embodiment of FIG. 5, the first and second open ends 51a and 51b face toward one another.

An advantage of the configuration of FIG. 5 is that each of the odd digit lines (DL1 and DL1*) has a first portion adjacent a region of one of the even digit lines (e.g., the odd digit line DL1 has a first portion 40a adjacent the even digit line DL2*), and has a second portion adjacent a region of a different one of the even digit lines (e.g., the odd digit line DL1 has a second portion 40b adjacent the even digit line DL0). Further, the even digit line adjacent the first portion of the odd digit line will be a different type of even digit line (either true or complementary) as compared to the even digit line adjacent the second portion of the odd digit line. For instance, in the shown embodiment the first portion 40a of the odd digit line DL1 is adjacent a region of the complementary even digit line DL2*, and the second portion 40b of the odd digit line DL1 is adjacent a region of the true even digit line DL0. Such may enable coupling noise along the adjacent digit lines DL1, DL0 and DL2* to be canceled during a differential sensing operation. Similarly, coupling noise along the adjacent digit lines DL1*, DL0 and DL2* may be canceled during a differential sensing operation. Accordingly, the configuration of FIG. 5 may advantageously reduce problematic coupling noise between adjacent digit lines.

FIG. 5A shows an alternative view of the assembly 10 of FIG. 5. Specifically, each of the decks 14 and 16 is diagrammatically illustrated, and regions of the digit lines DL0, DL1, DL1* and DL2* are diagrammatically illustrated as being associated with the decks. Additional digit lines are shown, but are not labeled.

Connections between the regions of the digit lines along the upper deck 16 with the regions of the digit lines along the lower deck 14 are diagrammatically illustrated with dashed lines 53 (only one of which is labeled), and such dashed lines extend to connection regions 55 (only two of which are labeled) which are diagrammatically illustrated with stippling.

Figure 6:
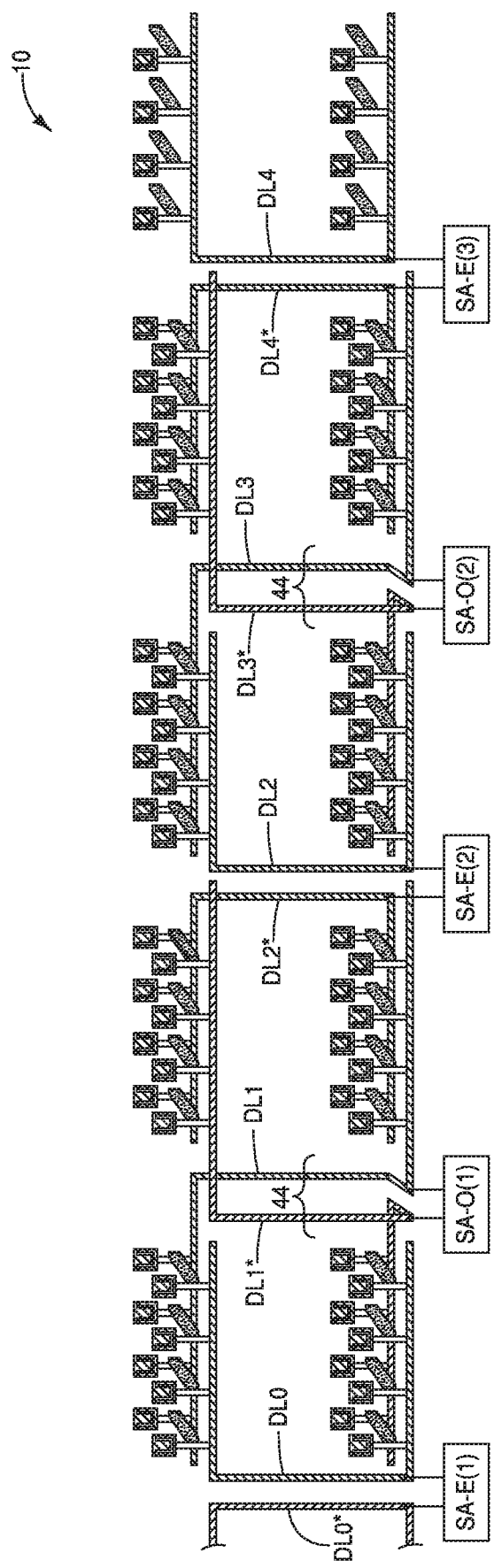
FIG. 6 is a diagrammatic side view of a region of an assembly comprising the layout of FIG. 5.

Referring to FIG. 6, such shows a larger portion of the integrated assembly 10 having the various structures described above with reference to FIG. 5. The view of FIG. 6 shows a couple of the twist regions 44 laterally displaced relative to one another, and shows various digit lines DL0, DL0*, DL1, DL1*, DL2, DL2*, DL3, DL3*, DL4 and DL4* arranged in comparatively paired configurations. Notably, the even paired configurations (e.g., SA-E(1)) are laterally offset relative to the odd paired configurations (e.g., SA-O (1)). Accordingly, the last of the illustrated even digit lines (DL4) is utilized solely for comparative pairing with the digit line DL4*, and is not in a noise-canceling relationship with any of the odd digit lines (e.g., DL3, DL3*).

Figure 7:
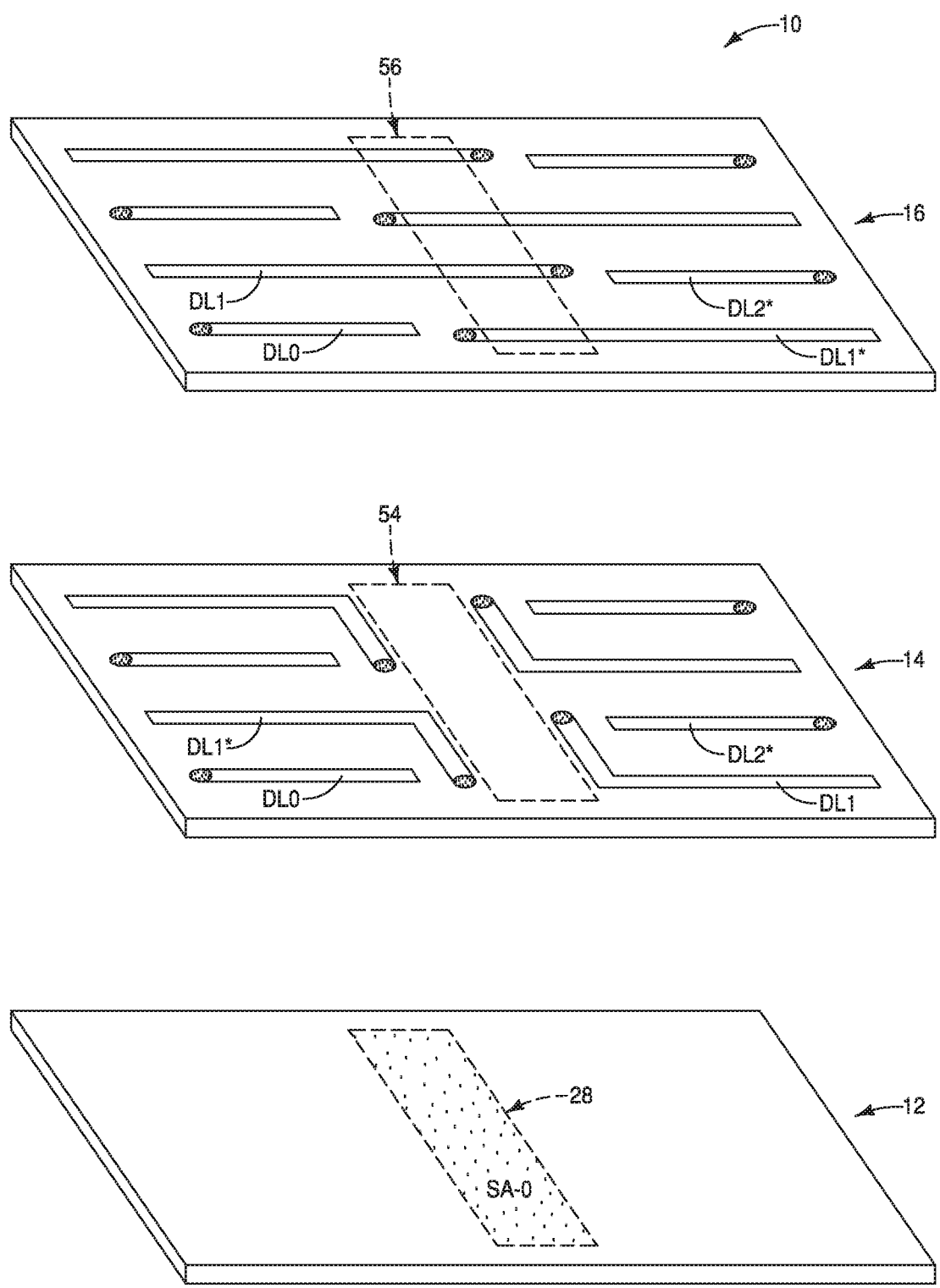
FIG. 7 is a multi-dimensional view of a region of an example assembly comprising the layout of FIG. 5A.

FIG. 7 shows the assemblies 10 of FIG. 5 utilizing a diagrammatic view of the type described above with reference to FIG. 5A. FIG. 7 also shows the base 12, and shows SENSE AMPLIFIER circuitry 28 (SA-O) associated with the base 12. A problem which may occur is that the illustrated configuration of the digit lines may block a region which would otherwise be utilized for access for interconnects extending to the SENSE AMPLIFIER circuitry. For instance, it may be desired to route power to the SENSE AMPLIFIER circuitry. Regions 54 and 56 are diagrammatically illustrated along the decks 14 and 16, with such regions corresponding to desired locations for windows to be formed to extend through the decks 14 and 16 for access to the SENSE AMPLIFIER circuitry 28.

One solution to the problem illustrated in FIG. 7 is described with reference to FIG. 8. Specifically, the digit lines are reconfigured to be clear of the window regions 54 and 56 so that interconnects may be extended through the window regions 54 and 56. An example interconnect 58 is shown extending from a power source 60 to the SENSE AMPLIFIER circuitry 28. The power source 60 may be utilized to provide the power to the SENSE AMPLIFIER circuitry during operation of such SENSE AMPLIFIER circuitry. Alternatively, the source 60 may correspond to input/output extending to the SENSE AMPLIFIER circuitry, and/or to any other structures/modules desired to be electrically coupled with the SENSE AMPLIFIER circuitry.

Figure 8:
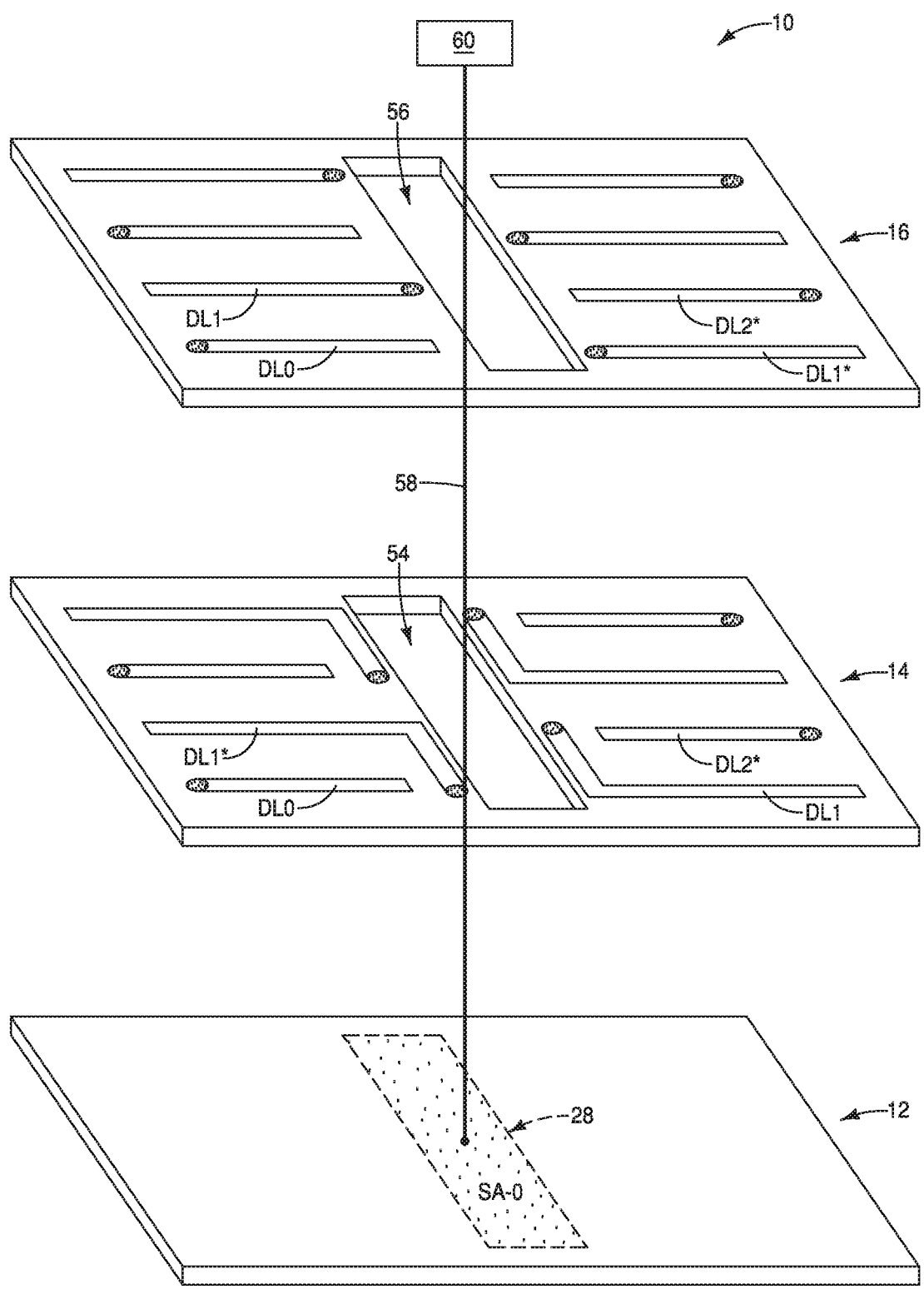
FIG. 8 is a multi-dimensional view of a region of an example assembly alternative to that of FIG. 7.

The window regions 54 and 56 of FIG. 8 are shown to correspond to first and second openings passing through the first and second decks 14 and 16, respectively; and the interconnect 58 passes through such first and second openings. In the embodiment of FIG. 8, the second opening 56 is directly over the first opening 54.

Figure 9:
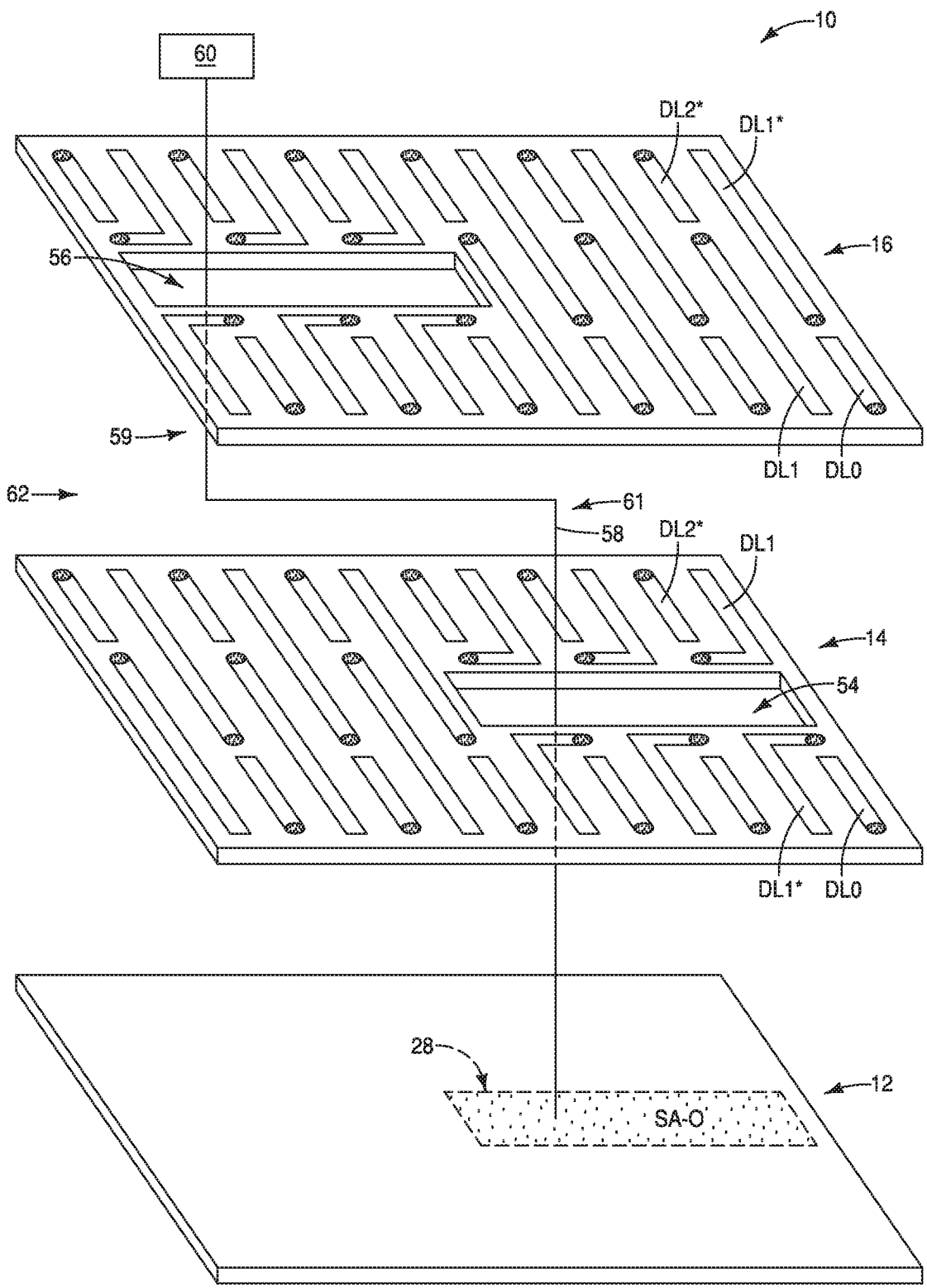
FIG. 9 is a multi-dimensional view of a region of an example assembly alternative to that of FIG. 8.

Another solution to the problem illustrated in FIG. 7 is described with reference to FIG. 9. The embodiment of FIG. 9 shows the digit lines arranged such that the window 56 (second opening) in the upper deck 16 is laterally offset relative to the window 54 (first opening) in the lower deck 14 (i.e., is not directly over the window 54). In some embodiments an intermediate region 62 is between the first and second decks 14 and 16, and the interconnect 58 is routed to extend laterally within such interconnect region so that the interconnect passes from a location 59 directly under the second opening 56 to another location 61 directly over the first opening 54.

The configurations described above with reference to FIGS. 5-9 may have SENSE AMPLIFIER circuitries and WORDLINE DRIVER circuitries associated with the base 12. The SENSE AMPLIFIER circuitries and WORDLINE DRIVER circuitries may be provided in any suitable arrangement. An example arrangement is described with reference to FIG. 10. Such example arrangement includes repeating patches (with an example patch being identified as a patch 63). Each patch includes digit lines (with two example digit lines being identified as DL0 and DL1). Some of the digit lines are coupled with SA-E circuitry and others are coupled with SA-O circuitry, as shown. Each patch also includes wordlines (with example wordlines being identified as WL1 and WL2). Some of the wordlines extend from WORDLINE DRIVER circuitries of the patch containing the wordlines, while others extend from WORDLINE DRIVER circuitries of neighboring patches.

The illustrated embodiment shows socket regions 64 along edges of the patches, with such socket regions enabling the passing of interconnects along edges of circuitry associated with the patches.

Twist regions 44 are diagrammatically illustrated relative to the patches. The twist regions would be within memory circuitry provided above the patches, but are diagrammatically illustrated in the patches to assist the reader in understanding possible relative locations of SENSE AMPLIFIER circuitries and WORDLINE DRIVER circuitries in comparison to the twist regions. In the shown application of FIG. 10, the even and odd SENSE AMPLIFIER circuitries (SA-E and SA-O) within a patch are both along the same side of a twist region 44, and are laterally spaced from one another. As described above with reference to FIG. 5, the twist regions 44 may comprise both the first vertically-extending segments 40c of the true digit lines DL1, and may comprise the second vertically-extending segments 42c of the complementary digit lines DL1*. Accordingly, the first and second SENSE AMPLIFIER circuitries may be on the same side of the first and second vertically-extending segments 40c and 42c.

Figure 10:
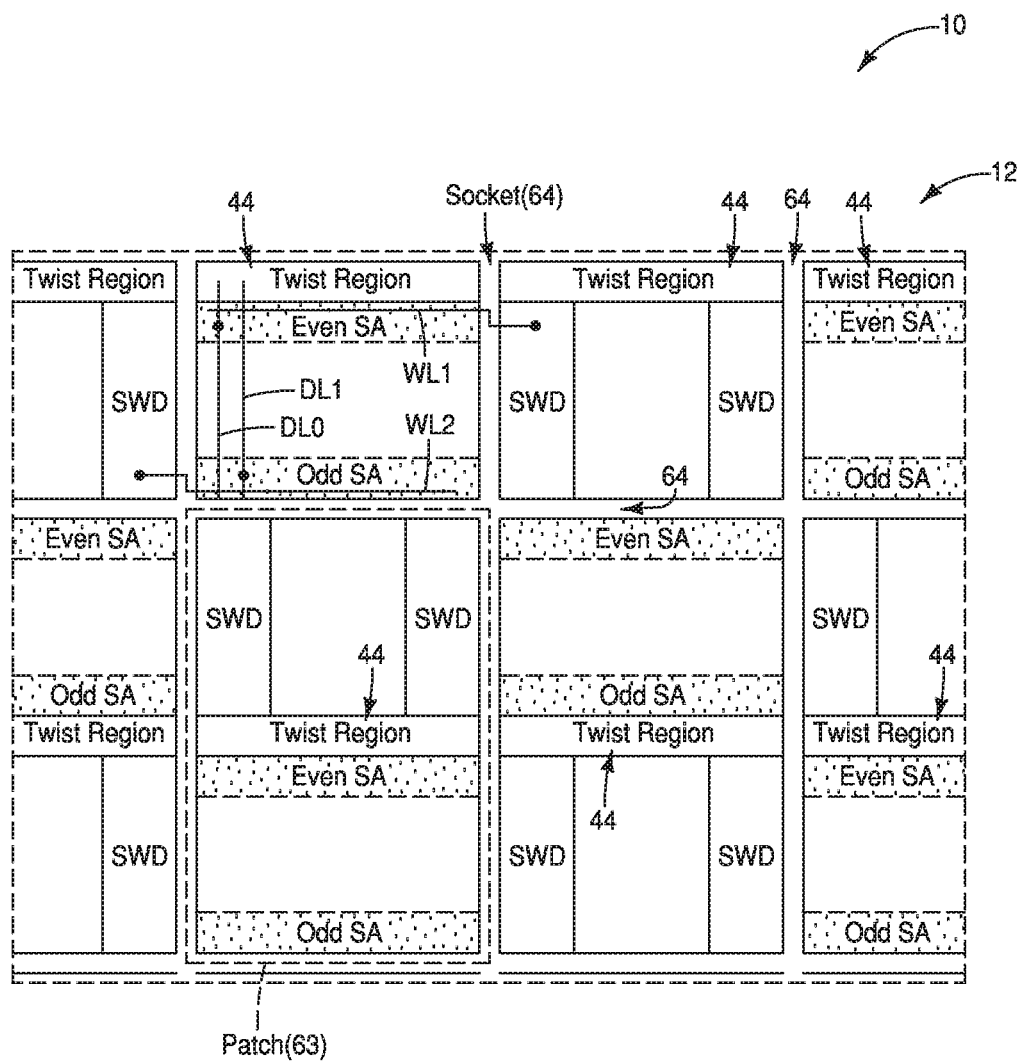
FIG. 10 is a diagrammatic top-down view of an example region of an example assembly.

In the illustrated embodiment of FIG. 10, the WORDLINE DRIVER circuitries (SWD) are laterally offset relative to the SENSE AMPLIFIER circuitries. In some embodiments, the WORDLINE DRIVER circuitries may be considered to be within second areas of the base 12, and the SENSE AMPLIFIER circuitries may be considered to be within first areas of such base. The second areas are laterally offset from the first areas. In some embodiments, at least some of the first and second areas may be directly under first and second memory cells of the first and second memory arrays, as described above with reference to FIG. 4.

Figure 11:
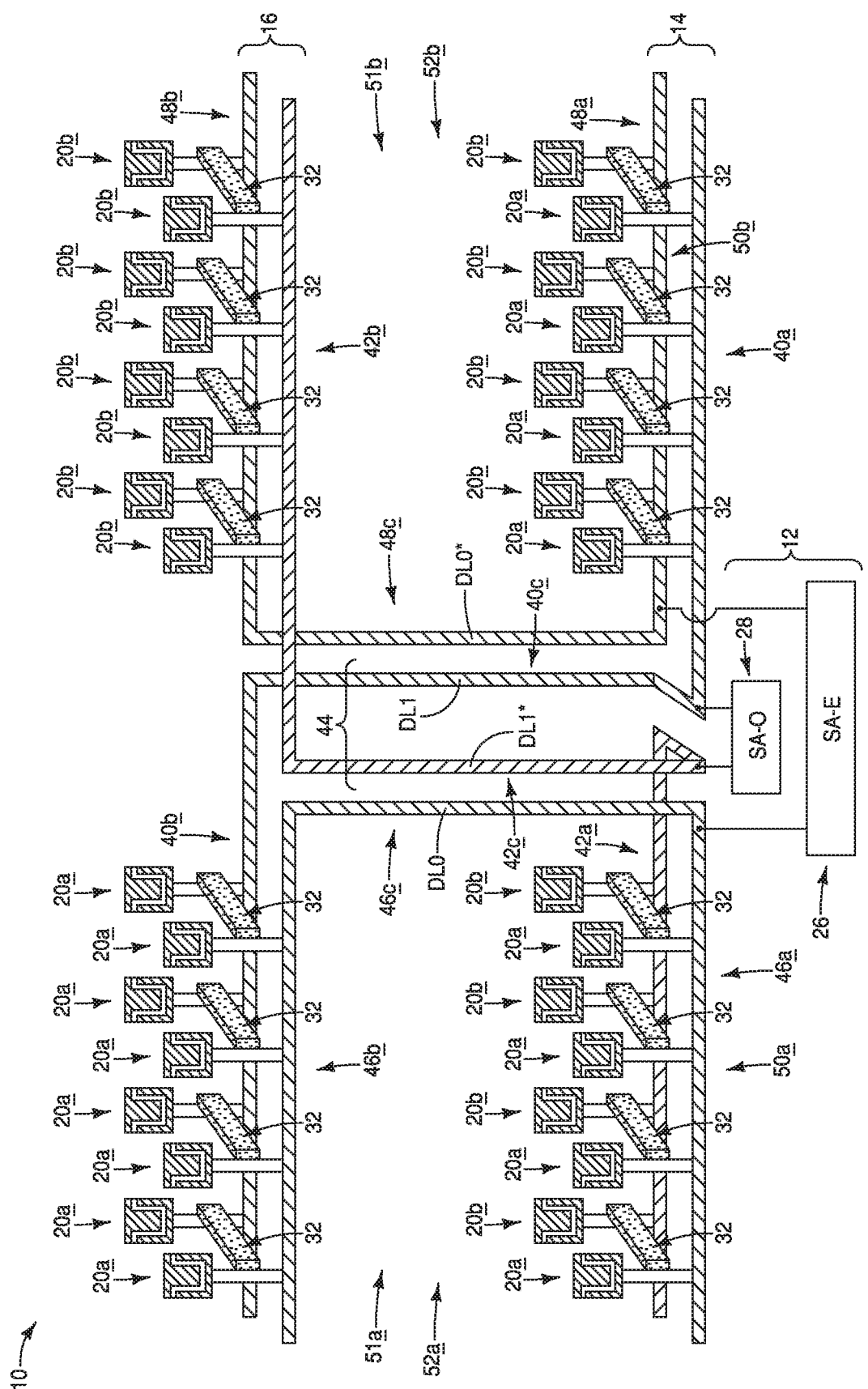
FIG. 11 is a diagrammatic multi-dimensional side view of an example layout of complementary digit lines within the example decks of FIG. 4.

FIG. 11 shows an integrated assembly 10 similar to that described above with reference to FIG. 5. However, the illustrated second digit lines include a second true digit line DL0 and a second complementary digit line DL0*which are comparatively coupled to one another through SA-E circuitry 26. The first and second sideways-opening containers 50a and 50b face away from one another rather than facing toward one another as they did in the configuration of FIG. 5.

Figure 11A:
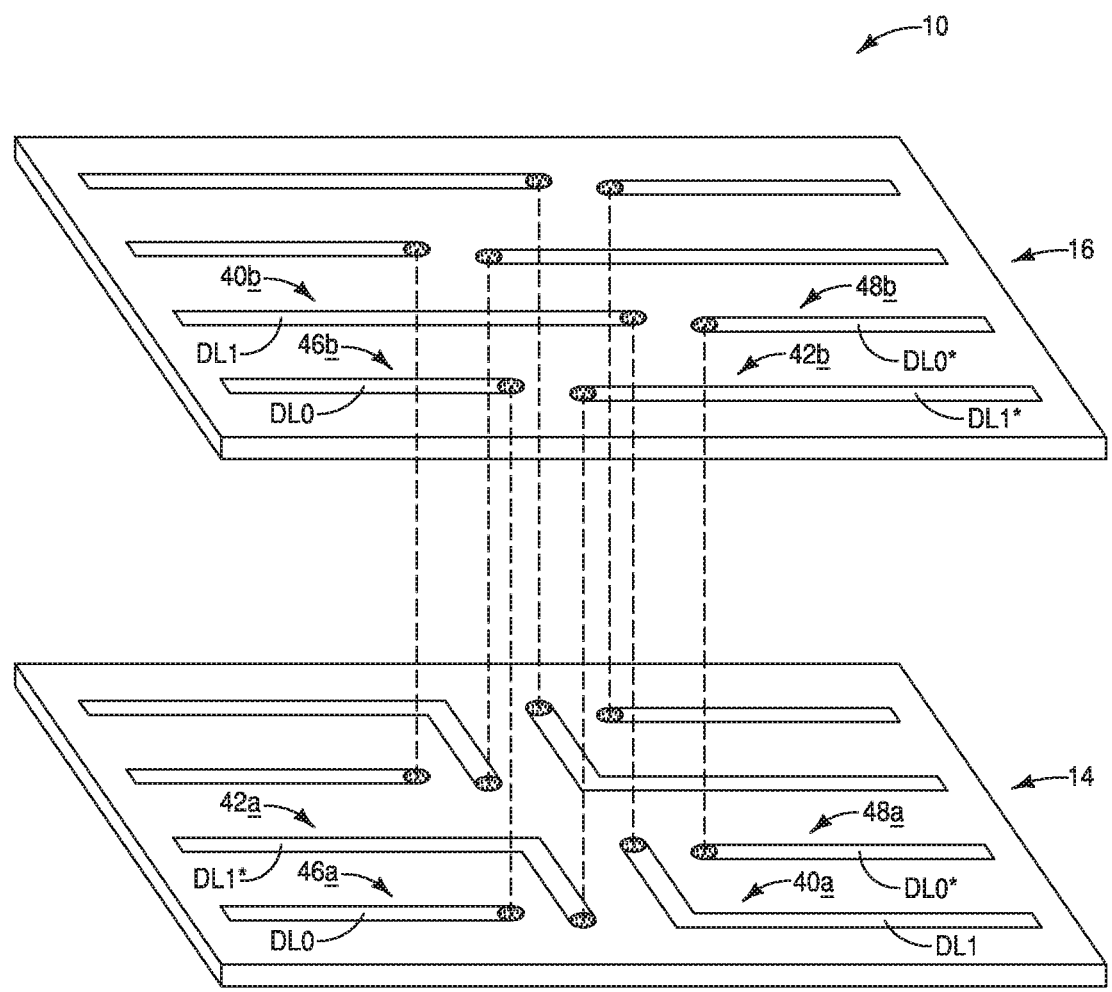
FIG. 11A is an alternative multi-dimensional view of the layout of FIG. 11.

FIG. 11A shows the assembly 10 of FIG. 11 in a view analogous to that utilized above in FIG. 5A.

Figure 12:
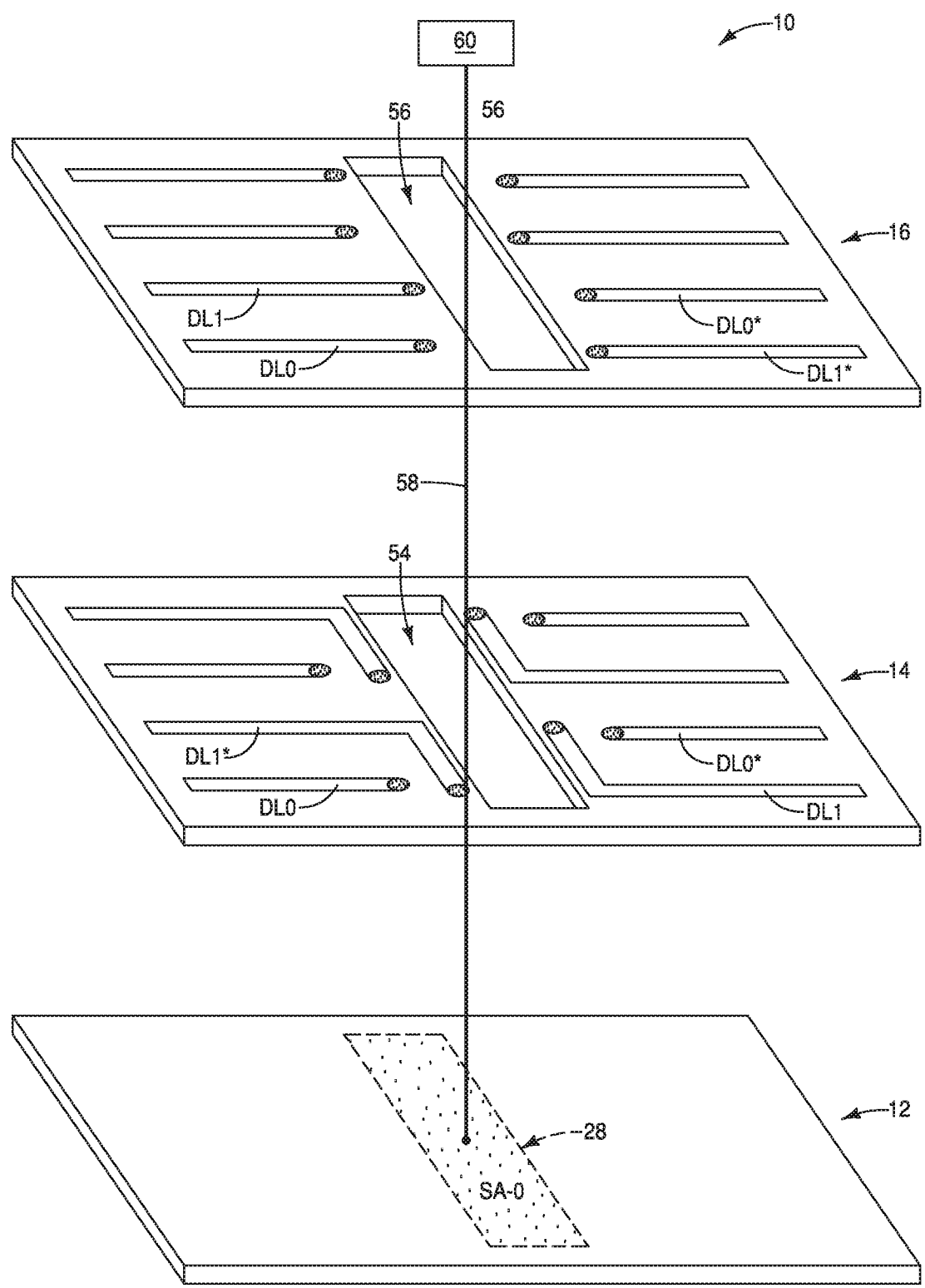
FIG. 12 is a multi-dimensional view of a region of an example assembly comprising a modification of the layout of FIG. 11A.

FIG. 12 shows the assembly 10 of FIG. 11 modified in a manner analogous that described above with reference to FIG. 8 to enable a pair of openings 54 and 56 to be formed within decks 14 and 16, with the opening 56 being directly above the opening 54. The interconnect 58 is shown passing through the openings 56 and 54, and coupling a power source 60 with SENSE AMPLIFIER circuitry 28.

Figure 13:
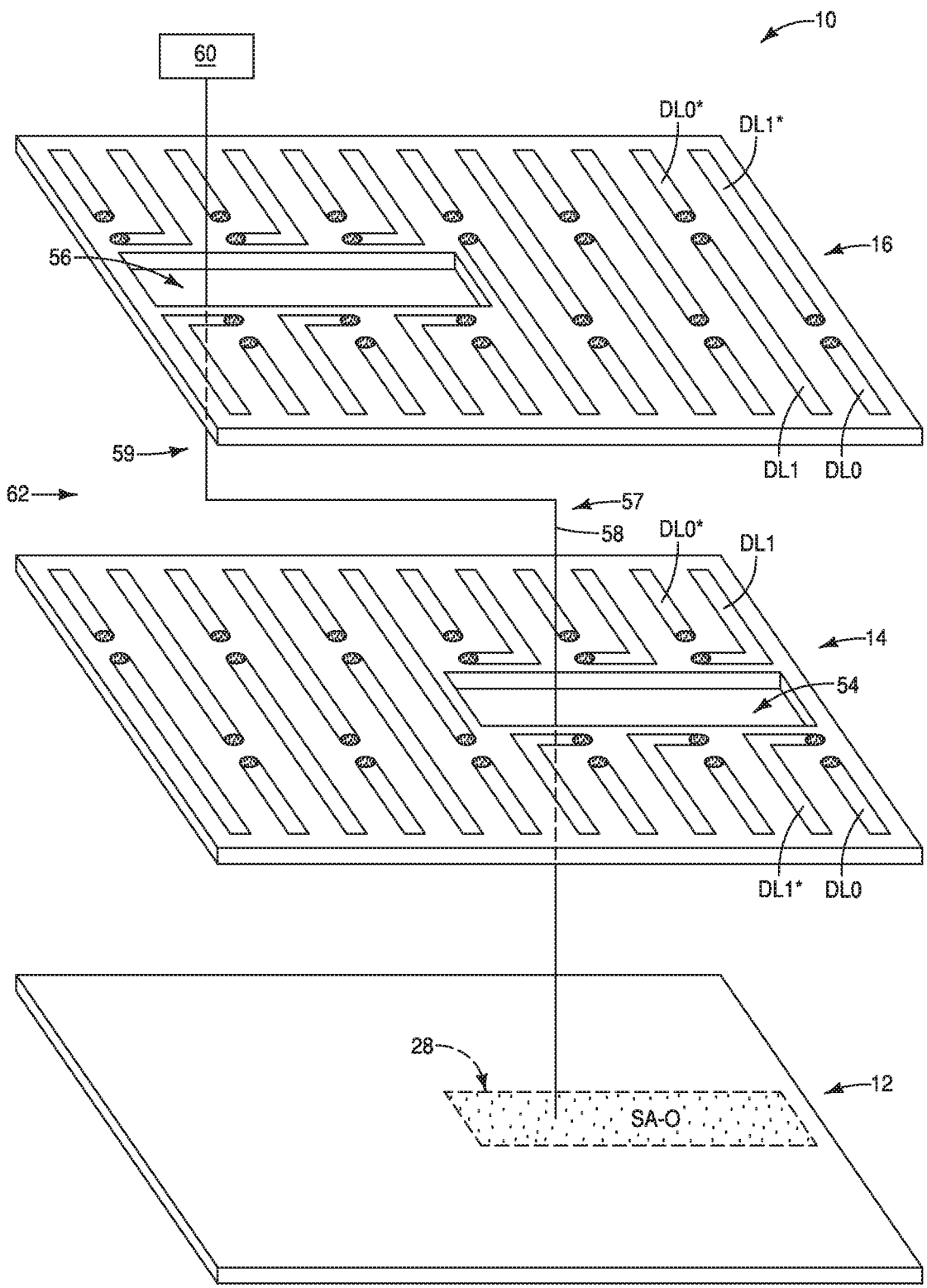
FIG. 13 is a multi-dimensional view of a region of an example assembly alternative to that of FIG. 12.

FIG. 13 shows the assembly 10 of FIG. 11 modified in a manner analogous to that described above with reference to FIG. 9. The window 56 in the upper deck 16 is laterally offset relative to the window 54 in the lower deck 14. Accordingly, the interconnect 58 passes through the window 56 to a location 59 within an intermediate regions 62 between the decks, then extends laterally along such intermediate region to a location 57 directly above the opening 54, and then extends through the opening 54 to couple with the SENSE AMPLIFIER circuitry 28.

The configurations described above with reference to FIGS. 11-13 may have SENSE AMPLIFIER circuitries and WORDLINE DRIVER circuitries associated with the base 12. The SENSE AMPLIFIER circuitries and WORDLINE DRIVER circuitries may be provided in any suitable arrangement. An example arrangement is described with reference to FIG. 14. Such example arrangement includes repeating patches (with an example patch being identified as a patch 63). Each patch includes digit lines (with two example digit lines being identified as DL1 and DL2). Some of the digit lines are coupled with SA-E circuitry and others are coupled with SA-O circuitry, as shown. Each patch also includes wordlines (with example wordlines being identified as WL1-WL4). Some of the wordlines extend from WORDLINE DRIVER circuitries of the patch containing the wordlines, while others extend from WORDLINE DRIVER circuitries of neighboring patches. Regions in which the digit lines are not in noise-canceling relationships with other digit lines are diagrammatically indicated with the term "Edge Patch Only", with such regions being utilized for comparative purposes only rather than for both comparative purposes and for noise canceling purposes.

The illustrated embodiment shows socket regions 64 along edges of the patches, with such socket regions enabling the passing of interconnects along edges of circuitry associated with the patches.

Twist regions 44 are diagrammatically illustrated relative to the patches. The twist regions would be within memory circuitry provided above the patches, but are diagrammatically illustrated in the patches to assist the reader in understanding possible relative locations of SENSE AMPLIFIER circuitries and WORDLINE DRIVER circuitries in comparison to the twist regions. In the shown application of FIG. 14, the even SENSE AMPLIFIER circuitry (SA-E) within a patch is along one side of a twist region 44, and the odd SENSE AMPLIFIER circuitry (SA-O) within the patch is along an opposing side of a twist region 44. In other words, the illustrated arrangement of FIG. 14 may be considered to correspond to an application which the first SENSE AMPLIFIER circuitry (e.g., SA-O) of FIG. 11 is along a first side of the illustrated twist region 44 within a patch 63 beneath such twist region, and the second SENSE AMPLIFIER circuitry (e.g., SA-E) of FIG. 11 is along a second side of the illustrated twist region 44 within the patch 63 beneath such twist region; where the second side is an opposing relation to the first side. As described above with reference to FIG. 11, the twist region 44 may comprise both the first vertically-extending segment 40c of the true digit line DL1, and may comprise the second vertically-extending segment 42c of the complementary digit line DL1*. Accordingly, the first and second SENSE AMPLIFIER circuitries may be on opposing sides of the first and second vertically-extending segments 40c and 42c relative to one another.

Figure 14:
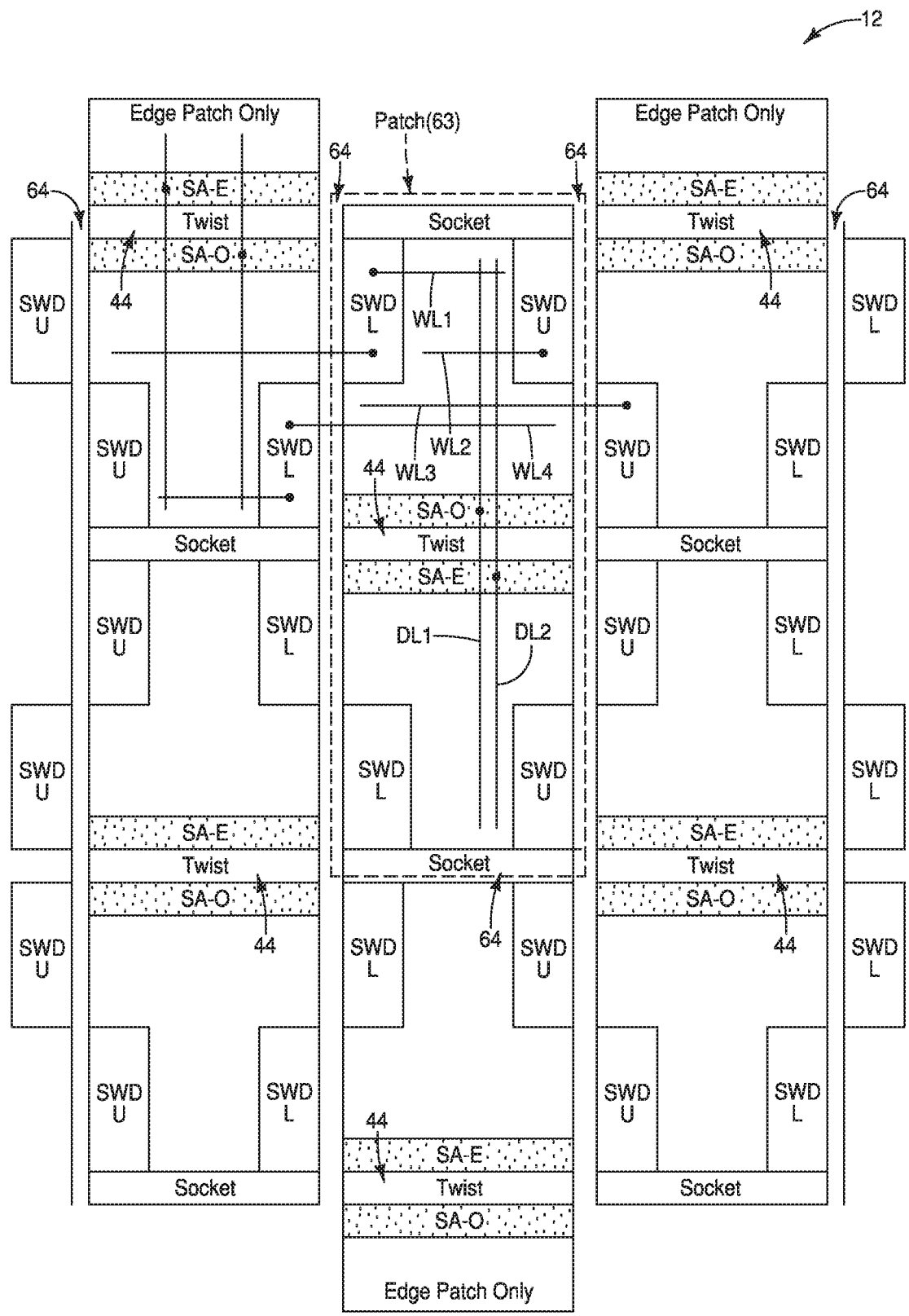
FIG. 14 is a diagrammatic top-down view of an example region of an example assembly.

In the illustrated embodiment of FIG. 14, the WORDLINE DRIVER circuitries (SWD) are laterally offset relative to the SENSE AMPLIFIER circuitries. In some embodiments, the WORDLINE DRIVER circuitries may be considered to be within second areas of the base 12, and the SENSE AMPLIFIER circuitries may be considered to be within first areas of such base. The second areas are laterally offset from the first areas. In some embodiments, at least some of the first and second areas may be directly under first and second memory cells of the first and second memory arrays, as described above with reference to FIG. 4.

The various chops (patterned etches) utilized to form the illustrated digit lines of FIGS. 5 and 11 may be along any suitable pitch, and in some embodiments may be along a pitch utilized to form the wordlines 32 of FIGS. 5 and 11.

Although the embodiments described herein indicate that there are two memory decks (14, 16) over a base 12, it is to be understood that in other embodiments there may be more than two memory decks over the base.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first deck, and having a second deck over the first deck. A first true digit line has a first region along the first deck, and has a second region along the second deck. A first complementary digit line has a first region along the first deck, and has a second region along the second deck. The first true digit line is comparatively compared to the first complementary digit line through SENSE AMPLIFIER circuitry. A second digit line has a first region along the first deck and laterally adjacent the first region of the first complementary digit line, and has a second region along the second deck and laterally adjacent the second region of the first true digit line.

Some embodiments include an integrated assembly having a base comprising first and second SENSE AMPLIFIER circuitries. A first deck is over the base. The first deck comprises a first portion of a first array of first memory cells, and comprises a first portion of a second array of second memory cells. A second deck is over the first deck. The second deck comprises a second portion of the first array of the first memory cells, and comprises a second portion of the second array of the second memory cells. A first true digit line is associated with the first array. The first true digit line has a first region associated with the first deck and has a second region associated with the second deck. A first complementary digit line is associated with the second array. The first complementary digit line has a first region associated with the first deck and has a second region associated with the second deck. The first true digit line is comparatively compared to the first complementary digit line through the first SENSE AMPLIFIER circuitry. A second true digit line is associated with the first array. The second true digit line has a first region laterally adjacent the first region of the first complementary digit line and has a second region laterally adjacent the second region of the first true digit line. A second complementary digit line is associated with the second array. The second complementary digit line has a first region laterally adjacent the first region of the first true digit line and has a second region laterally adjacent the second region of the first complementary digit line.

Some embodiments include an integrated assembly having a base comprising SENSE AMPLIFIER circuitries. A first deck is over the base. The first deck comprises a first portion of a first array of first memory cells, and comprises a first portion of a second array of second memory cells. A second deck is over the first deck. The second deck comprises a second portion of the first array of the first memory cells, and comprises a second portion of the second array of the second memory cells. A first set of true and complementary digit lines is associated with the first and second arrays. The true digit lines of the first set are comparatively coupled to the complementary digit lines of the first set through a first set of the SENSE AMPLIFIER circuitries. A second set of true and complementary digit lines is associated with the first and second arrays. The true digit lines of the second set are comparatively coupled to the complementary digit lines of the second set through a second set of the SENSE AMPLIFIER circuitries. The true digit lines of the second set have first regions laterally adjacent first regions of the complementary digit lines of the first set, and have second regions laterally adjacent second regions of the true digit lines of the first set. The complementary digit lines of the second set have first regions laterally adjacent first regions of the true digit lines of the first set, and have second regions laterally adjacent second regions of the complementary digit lines of the first set. A first opening passes through the first deck, and a second opening passes through the second deck. An interconnect extends from a power source to one of the SENSE AMPLIFIER circuitries. The interconnect extends through the first and second openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a base comprising SENSE AMPLIFIER circuitry;
   a first deck over the base;
   a second deck over the first deck;

a first true digit line having a first region along the first deck and having a second region along the second deck;

a first complementary digit line having a first region along the first deck and having a second region along the second deck; the first true digit line being comparatively compared to the first complementary digit line through the SENSE AMPLIFIER circuitry; and a second digit line having a first region along the first deck and laterally adjacent the first region of the first complementary digit line, and having a second region along the second deck and laterally adjacent the second region of the first true digit line.

2. The integrated assembly of claim 1 wherein the second digit line is a second true digit line, and further comprising a second complementary digit line; the second complementary digit line having a first region along the first deck and laterally adjacent the first region of the first true digit line, and having a second region along the second deck and laterally adjacent the second region of the first complementary digit line.

3. The integrated assembly of claim 2 wherein the second complementary digit line is comparatively coupled to the second true digit line.

4. An integrated assembly, comprising:

a first deck;

a second deck over the first deck;

a first true digit line having a first region along the first deck and having a second region along the second deck;

a first complementary digit line having a first region along the first deck and having a second region along the second deck; the first true digit line being comparatively compared to the first complementary digit line through SENSE AMPLIFIER circuitry; and a second digit line having a first region along the first deck and laterally adjacent the first region of the first complementary digit line, and having a second region along the second deck and laterally adjacent the second region of the first true digit line, the second digit line being a second true digit line, and further comprising a second complementary digit line, the second complementary digit line having a first region along the first deck and laterally adjacent the first region of the first true digit line, and having a second region along the second deck and laterally adjacent the second region of the first complementary digit line, wherein the second complementary digit line is not comparatively coupled to the second true digit line.

5. The integrated assembly of claim 2 wherein wordlines extend from memory cells along the first region of the second true digit line to memory cells along the first region of the first complementary digit line.

6. The integrated assembly of claim 2 wherein wordlines extend from memory cells along the second region of the second true digit line to memory cells along the second region of the first true digit line.

7. The integrated assembly of claim 2 wherein wordlines extend from memory cells along the second region of the second complementary digit line to memory cells along the second region of the first complementary digit line.

8. The integrated assembly of claim 2 wherein wordlines extend from memory cells along the first region of the second complementary digit line to memory cells along the first region of the first true digit line.

9. An integrated assembly, comprising:

a first deck;

a second deck over the first deck;

a first true digit line having a first region along the first deck and having a second region along the second deck;

a first complementary digit line having a first region along the first deck and having a second region along the second deck; the first true digit line being comparatively compared to the first complementary digit line through SENSE AMPLIFIER circuitry; and a second digit line having a first region along the first deck and laterally adjacent the first region of the first complementary digit line, and having a second region along the second deck and laterally adjacent the second region of the first true digit line, the second digit line being a second true digit line, and further comprising a second complementary digit line, the second complementary digit line having a first region along the first deck and laterally adjacent the first region of the first true digit line, and having a second region along the second deck and laterally adjacent the second region of the first complementary digit line, wherein the second true digit line and the second complementary digit line are configured as first and second sideways-opening containers, respectively; with said first and second sideways-opening containers having first and second openings extending therein, respectively.

10. The integrated assembly of claim 9 wherein the first and second openings of the first and second sideways-opening containers face toward one another.

11. The integrated assembly of claim 9 wherein the first and second openings of the first and second sideways-opening containers face away from one another.

12. An integrated assembly, comprising:

a base comprising first and second SENSE AMPLIFIER circuitries;

a first deck over the base; the first deck comprising a first portion of a first array of first memory cells, and comprising a first portion of a second array of second memory cells;

a second deck over the first deck; the second deck comprising a second portion of the first array of the first memory cells, and comprising a second portion of the second array of the second memory cells;

a first true digit line associated with the first array, the first true digit line having a first region associated with the first deck and having a second region associated with the second deck;

a first complementary digit line associated with the second array, the first complementary digit line having a first region associated with the first deck and having a second region associated with the second deck; the first true digit line being comparatively compared to the first complementary digit line through the first SENSE AMPLIFIER circuitry;

a second true digit line associated with the first array; the second true digit line having a first region laterally adjacent the first region of the first complementary digit line and having a second region laterally adjacent the second region of the first true digit line; and a second complementary digit line associated with the second array; the second complementary digit line having a first region laterally adjacent the first region of the first true digit line and having a second region laterally adjacent the second region of the first complementary digit line.

13. The integrated assembly of claim 12 wherein wordlines extend from memory cells along the first region of the second true digit line to memory cells along the first region of the first complementary digit line.

14. The integrated assembly of claim 12 wherein wordlines extend from memory cells along the second region of the second true digit line to memory cells along the second region of the first true digit line.

15. The integrated assembly of claim 12 wherein wordlines extend from memory cells along the second region of the second complementary digit line to memory cells along the second region of the first complementary digit line.

16. The integrated assembly of claim 12 wherein wordlines extend from memory cells along the first region of the second complementary digit line to memory cells along the first region of the first true digit line.

17. The integrated assembly of claim 12 wherein:
a vertically-extending segment extends from the first region of the first true digit line to the second region of the first true digit line;
the first SENSE AMPLIFIER circuitry is laterally offset to a first side of the vertically-extending segment; and
the second SENSE AMPLIFIER circuitry is laterally offset to a second side of the vertically-extending segment, with the second side being in opposing relation to the first side.

18. The integrated assembly of claim 17 wherein:
the vertically-extending segment is a first vertically-extending segment;
a second vertically-extending segment extends from the first region of the first complementary digit line to the second region of the first complementary digit line;
the first SENSE AMPLIFIER circuitry is laterally offset to the first side of the second vertically-extending segment; and
the second SENSE AMPLIFIER circuitry is laterally offset to the second side of the second vertically-extending segment.

19. The integrated assembly of claim 18 wherein:
wordlines extend from memory cells along the first true and complementary digit lines to memory cells along the second true and complementary digit lines;
WORDLINE DRIVER circuitries are coupled with the wordlines;
the first and second SENSE AMPLIFIER circuitries are along first areas of the base;
the WORDLINE DRIVER circuitries are along second areas of the base which are laterally offset from the first areas of the base; and
at least some of the first and second areas are directly under the first and second memory cells of the first and second arrays.

20. The integrated assembly of claim 12 wherein:
a first vertically-extending segment extends from the first region of the first true digit line to the second region of the first true digit line;
a second vertically-extending segment extends from the first region of the first complementary digit line to the second region of the first complementary digit line; and
the first and second SENSE AMPLIFIER circuitries are both laterally offset to a first side of the second vertically-extending segment.

21. The integrated assembly of claim 20 wherein:
wordlines extend from memory cells along the first true and complementary digit lines to memory cells along the second true and complementary digit lines;
WORDLINE DRIVER circuitries are coupled with the wordlines;
the first and second SENSE AMPLIFIER circuitries are along first areas of the base;
the WORDLINE DRIVER circuitries are along second areas of the base which are laterally offset from the first areas of the base; and
at least some of the first and second areas are directly under the first and second memory cells of the first and second arrays.

22. The integrated assembly of claim 12 wherein the second complementary digit line is comparatively coupled to the second true digit line.

23. The integrated assembly of claim 12 wherein the second complementary digit line is not comparatively coupled to the second true digit line.

24. The integrated assembly of claim 12 wherein:
the first region of the second true digit line is along a first end section of the second true digit line;
the second region the second true digit line is along an opposing second end section of the second true digit line;
a first vertically-extending segment extends between the first and second end sections of the second true digit line;
the first region of the second complementary digit line is along a first end section of the second complementary digit line;
the second region the second complementary digit line is along an opposing second end section of the second complementary digit line; and
a second vertically-extending segment extends between the first and second end sections of the second complementary digit line.

25. The integrated assembly of claim 24 wherein:
the second true digit line is shaped as a first sideways-opening container, with said first sideways-opening container having a first closed end corresponding to the first vertically-extending segment and having a first open end in opposing relation to the first closed end; and
the second complementary digit line is shaped as a second sideways-opening container, with said second sideways-opening container having a second closed end corresponding to the second vertically-extending segment and having a second open end in opposing relation to the second closed end.

26. The integrated assembly of claim 25 wherein the first and second open ends face toward one another.

27. The integrated assembly of claim 25 wherein the first and second open ends face away from one another.

28. An integrated assembly, comprising:
a base comprising SENSE AMPLIFIER circuitries;
a first deck over the base; the first deck comprising a first portion of a first array of first memory cells, and comprising a first portion of a second array of second memory cells;
a second deck over the first deck; the second deck comprising a second portion of the first array of the first memory cells, and comprising a second portion of the second array of the second memory cells;
a first set of true and complementary digit lines associated with the first and second arrays; the true digit lines of the first set being comparatively coupled to the complementary digit lines of the first set through a first set of the SENSE AMPLIFIER circuitries;
a second set of true and complementary digit lines associated with the first and second arrays; the true digit lines of the second set being comparatively coupled to the complementary digit lines of the second set through a second set of the SENSE AMPLIFIER circuitries;

the true digit lines of the second set having first regions laterally adjacent first regions of the complementary digit lines of the first set, and having second regions laterally adjacent second regions of the true digit lines of the first set;

the complementary digit lines of the second set having first regions laterally adjacent first regions of the true digit lines of the first set, and having second regions laterally adjacent second regions of the complementary digit lines of the first set;

a first opening passing through the first deck, and a second opening passing through the second deck; and an interconnect extending from a power source to one of the SENSE AMPLIFIER circuitries; the interconnect extending through the first and second openings.

29. The integrated assembly of claim 28 wherein:

the second true digit lines are configured as sideways-opening first containers, with said first containers having first open edges;

the second complementary digit lines are configured as sideways-opening second containers, with said second containers having second open edges; and the first and second open edges face toward one another.

30. The integrated assembly of claim 28 wherein:

the second true digit lines are configured as sideways-opening first containers, with said first containers having first open edges;

the second complementary digit lines are configured as sideways-opening second containers, with said second containers having second open edges; and the first and second open edges face away from one another.

31. The integrated assembly of claim 28 wherein the second opening is directly over the first opening.

32. The integrated assembly of claim 28 wherein the second opening is not directly over the first opening.

33. The integrated assembly of claim 32 wherein an intermediate region is between the first and second decks, and wherein the interconnect extends laterally along such intermediate region to pass from a location directly under the second opening to another location directly over the first opening.

* * * * *